US010134831B2

(12) United States Patent
Balakrishnan et al.

(10) Patent No.: US 10,134,831 B2
(45) Date of Patent: Nov. 20, 2018

(54) DEFORMABLE AND FLEXIBLE CAPACITOR

(71) Applicant: International Business Machines Corporation, Armonk, NY (US)

(72) Inventors: Karthik Balakrishnan, White Plains, NY (US); Stephen W. Bedell, Wappingers Falls, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/067,794

(22) Filed: Mar. 11, 2016

(65) Prior Publication Data

US 2017/0263695 A1    Sep. 14, 2017

(51) Int. Cl.
*H01L 49/02* (2006.01)
*H01L 27/06* (2006.01)

(52) U.S. Cl.
CPC .......... *H01L 28/90* (2013.01); *H01L 27/0629* (2013.01)

(58) Field of Classification Search
CPC ..... H01L 2924/181; H01L 2924/00012; H01L 2224/16145; H01L 2224/16225; H01L 28/65; H01L 28/90; H01L 28/92; H01L 2924/15153; H01L 2924/15184; H01L 2924/15192; H01L 2924/16151; H01L 2924/16152; H01L 28/91
USPC .......................................... 257/534; 438/386
See application file for complete search history.

(56) References Cited

U.S. PATENT DOCUMENTS

| | | | | |
|---|---|---|---|---|
| 5,517,056 A * | 5/1996 | Bigler | ................... | H01L 21/565 257/666 |
| 6,011,697 A * | 1/2000 | Budnaitis | .............. | H01L 23/142 174/255 |
| 6,034,422 A * | 3/2000 | Horita | ............... | H01L 23/49582 257/666 |
| 6,087,714 A * | 7/2000 | Kubara | ............ | H01L 23/49582 257/666 |
| 6,228,707 B1* | 5/2001 | Lin | ........................ | H01L 28/40 257/E21.008 |
| 9,647,057 B2* | 5/2017 | Voiron | .................... | H01L 28/87 |
| 2001/0044013 A1* | 11/2001 | McDonough | ...... | G06K 19/0776 428/202 |
| 2004/0009641 A1* | 1/2004 | Kawase | ........... | H01L 21/76802 438/253 |
| 2005/0168108 A1* | 8/2005 | Face | .................. | H01H 13/7006 310/330 |
| 2007/0032089 A1* | 2/2007 | Nuzzo | ..................... | H01L 21/30 438/725 |
| 2013/0241939 A1* | 9/2013 | Lasiter | .................. | H01L 23/642 345/501 |

(Continued)

*Primary Examiner* — Edward Chin
(74) *Attorney, Agent, or Firm* — Cantor Colburn LLP

(57) ABSTRACT

A method for forming a capacitive device comprises forming a first dielectric layer on a substrate. Portions of the first dielectric layer are removed to for form a cavity in the first dielectric layer. A first layer of conductive material is deposited on the first dielectric layer and conformally along sidewalls of the cavity. The method further includes depositing a second dielectric layer on the first layer of conductive material, and depositing a second layer of conductive material on the second dielectric layer to form a capacitive device.

11 Claims, 14 Drawing Sheets

(56) References Cited

U.S. PATENT DOCUMENTS

| | | | | |
|---|---|---|---|---|
| 2015/0102461 A1* | 4/2015 | Lee | ................... | H01L 27/10814 |
| | | | | 257/532 |
| 2015/0364538 A1* | 12/2015 | Wang | ...................... | H01L 28/65 |
| | | | | 257/534 |
| 2016/0020267 A1* | 1/2016 | Lin | ........................ | H01L 28/91 |
| | | | | 257/532 |

* cited by examiner

DEFORMABLE AND FLEXIBLE CAPACITOR

BACKGROUND

The present invention generally relates to electronic devices, and more specifically, to capacitors.

Flexible and deformable substrates for electronic devices provide for electronic devices that may be used in a variety of new environments and devices. For example, an electronic device with a flexible and deformable substrate may be used in wearable devices that may not practically accommodate a rigid substrate.

Device packaging may also benefit from flexible or deformable substrates since previous rigid substrates are typically planar. Thus, a device package may be designed to accommodate a flexible or deformable substrate; such a device package may be shaped differently (e.g., curved or rounded) than a device package that is designed to package a rigid substrate.

Typical electronic devices include capacitors arranged on a substrate. A capacitor stores electrical energy in an electric field. Capacitors typically include two electrical conductors or plates with a dielectric or insulator material arranged between the conductors. In operation, when a voltage applied across the conductors induces an electric field across the dielectric material. This results in a positive charge on one of the conductors and a negative charge in the other conductor.

SUMMARY

According to an embodiment of the present invention, a method for forming a capacitive device comprises forming a first dielectric layer on a substrate. Portions of the first dielectric layer are removed to for form a cavity in the first dielectric layer. A first layer of conductive material is deposited on the first dielectric layer and conformally along sidewalls of the cavity. The method further includes depositing a second dielectric layer on the first layer of conductive material, and depositing a second layer of conductive material on the second dielectric layer to form a capacitive device.

According to another embodiment of the present invention, a method for forming a capacitive device comprises forming a semiconductor device on a substrate. A first dielectric layer is formed over exposed portions of the substrate and the semiconductor device. A second dielectric layer is formed over the first dielectric layer and portions of the second dielectric layer are removed to form a cavity in the first dielectric layer. A first layer of conductive material is formed on the second dielectric layer and conformally along sidewalls of the cavity. The method further includes depositing a third dielectric layer on the first layer of conductive material, and depositing a second layer of conductive material on the third dielectric layer to form a capacitive device.

According to yet another embodiment of the present invention, a capacitive device comprises a substrate and a first dielectric layer arranged on the substrate. The capacitive device further comprises a first cavity partially defined by the first dielectric layer and a first conductive layer arranged on the first dielectric layer and conformally along sidewalls of the first cavity. A second dielectric layer is arranged on the first conductive layer, and a second conductive layer is arranged on the second dielectric layer.

BRIEF DESCRIPTION OF THE DRAWINGS

FIGS. 1-12 illustrate an exemplary method for forming a flexible and deformable capacitor device.

FIG. 1 illustrates a side view of a substrate.

FIG. 2 illustrates a side view of the substrate following the formation of semiconductor devices that are arranged on the substrate.

FIG. 3 illustrates a side view following the deposition of an interlayer dielectric layer over exposed portions of the substrate and the semiconductor devices.

FIG. 4 illustrates a side view following the deposition of a flexible and deformable interlayer dielectric material (deformable dielectric material) over the interlayer dielectric material.

FIG. 6 illustrates a side view following the deposition of a first terminal layer over exposed portions of the interlayer dielectric layer and the deformable dielectric material.

FIG. 7 illustrates a side view following the deposition of a capacitor dielectric layer over exposed portions of the first terminal layer.

FIG. 8 illustrates a side view following the deposition of a second terminal layer over exposed portions of the capacitor dielectric layer.

FIG. 9 illustrates a side view following a lithographic patterning and etching process that removes exposed portions of the second terminal layer and exposes portions of the capacitor dielectric layer in the region.

FIG. 10 illustrates a side view following the deposition of a second deformable dielectric material layer over exposed portions of the capacitor dielectric layer and the second terminal layer.

FIG. 11 illustrates a side view following the formation of cavities.

FIG. 12 illustrates a side view following the formation of conductive contacts in the cavities (of FIG. 11).

DETAILED DESCRIPTION

A flexible (bendable) and deformable (stretchable or compressible) substrate that has a number of electronic devices arranged on the flexible and deformable substrate may include capacitive devices. If the substrate is flexed or deformed, the capacitive devices arranged on the substrate will also flex or deform. Such a flex or deformation of a capacitive device may undesirably change the performance of the capacitive device.

In the illustrated methods and resultant structures described herein, a capacitor device that substantially maintains its capacitive properties while being flexed or deformed is described.

FIGS. 1-12 illustrate an exemplary method for forming a flexible and deformable capacitor device.

Figure 1:
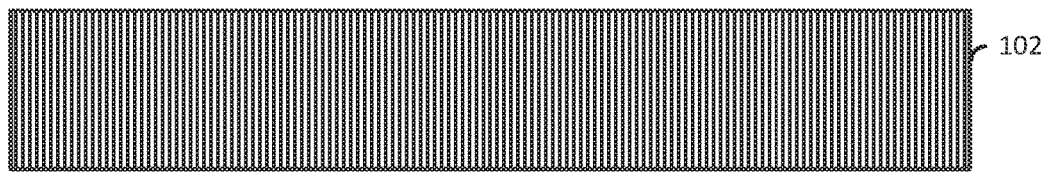

FIG. 1 illustrates a side view of a substrate 102. The substrate 102 in the illustrated embodiment is a flexible and deformable substrate material that allows the substrate 102 to bend, flex, stretch, and compress without breaking when force is applied to the substrate 102. The substrate 102 may include, for example, a thin silicon substrate having a thickness, of about 50 micrometers or less, or other flexible semiconductor substrate materials.

Figure 2:
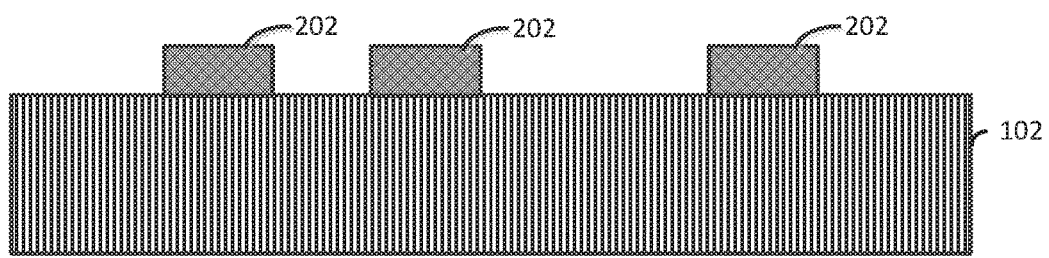

FIG. 2 illustrates a side view of the substrate 102 following the formation of semiconductor devices 202 that are arranged on the substrate 102. The semiconductor devices 202 may include, for example, field effect transistor (FET) devices or any other type of semiconductor device that may be used in an electronic circuit or device.

Figure 3:
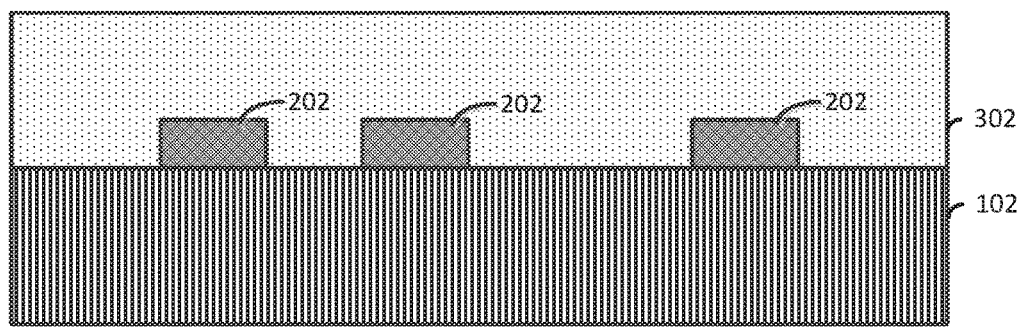

FIG. 3 illustrates a side view following the deposition of an interlayer dielectric layer 302 over exposed portions of the substrate 102 and the semiconductor devices 202. The interlayer dielectric layer 302 is formed from, for example, a low-k dielectric material (with k<4.0), including but not limited to, silicon oxide, spin-on-glass, a flowable oxide, a high density plasma oxide, borophosphosilicate glass (BPSG), or any combination thereof.

The interlayer dielectric layer 302 is deposited by a deposition process, including, but not limited to CVD, PVD, plasma enhanced CVD, atomic layer deposition (ALD), evaporation, chemical solution deposition, or like processes. Following the deposition of the interlayer dielectric layer 302, a planarization process such as, for example, chemical mechanical polishing is performed.

Figure 4:
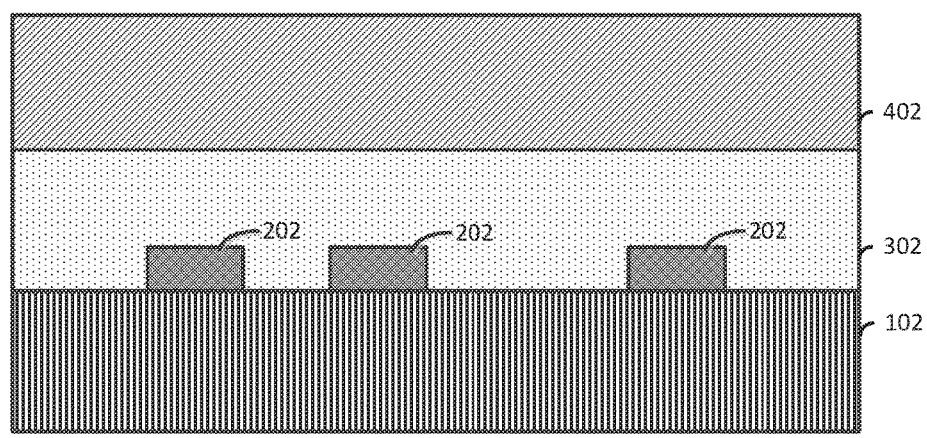

FIG. 4 illustrates a side view following the deposition of a flexible and deformable interlayer dielectric material (deformable dielectric material) 402 over the interlayer dielectric material 302.

The interlayer dielectric layer 402 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The interlayer dielectric layer 402 is deposited by a deposition process, including, but not limited to CVD, PVD, plasma enhanced CVD, atomic layer deposition (ALD), evaporation, chemical solution deposition, or like processes. Following the deposition of the interlayer dielectric layer 402, a planarization process such as, for example, chemical mechanical polishing is performed.

Figure 5A:
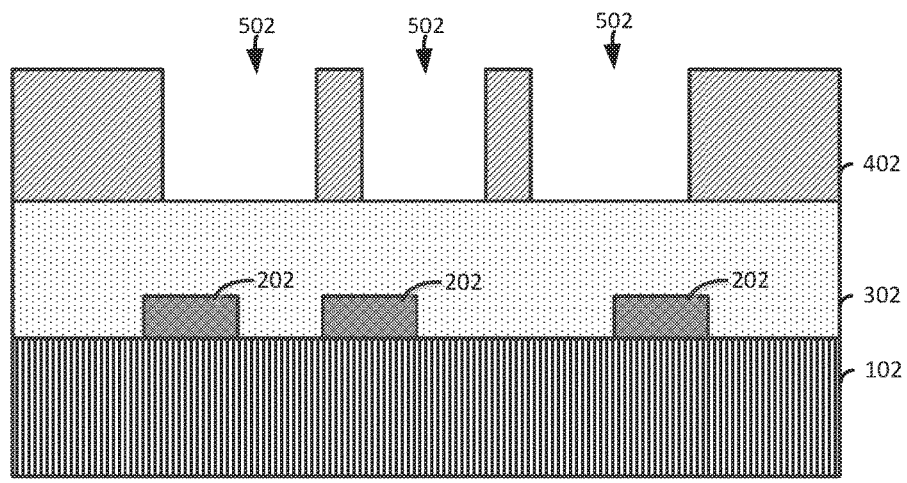
FIG. 5A illustrates a side view following, for example, a lithographic patterning and anisotropic etching process.

FIG. 5A illustrates a side view following, for example, a lithographic patterning and anisotropic etching process such as, for example, reactive ion etching (RIE). The etching process removes portions of the deformable dielectric material 402 and forms cavities 502 that expose portions of the interlayer dielectric layer 302. The patterning process may include, for example, depositing a resist mask (not shown). Suitable resist masks include photoresists, electron-beam resists, ion-beam resists, X-ray resists, and etch resists. The resist may a polymeric spin on material or a polymeric material.

Figure 5B:
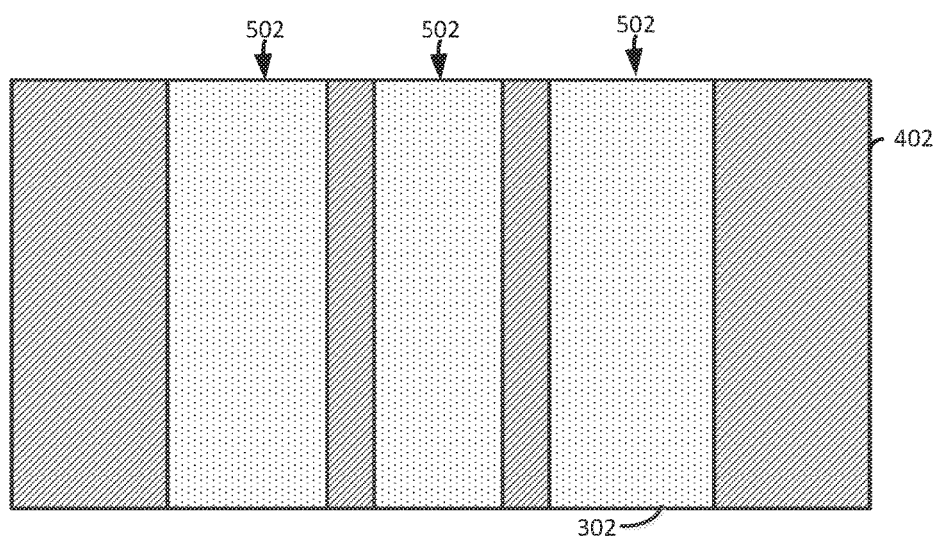
FIG. 5B illustrates a top view of the cavities that are partially defined by the interlayer dielectric layer and the deformable dielectric material.

FIG. 5B illustrates a top view of the cavities 502 that are partially defined by the interlayer dielectric layer 302 and the deformable dielectric material 402.

Figure 6:
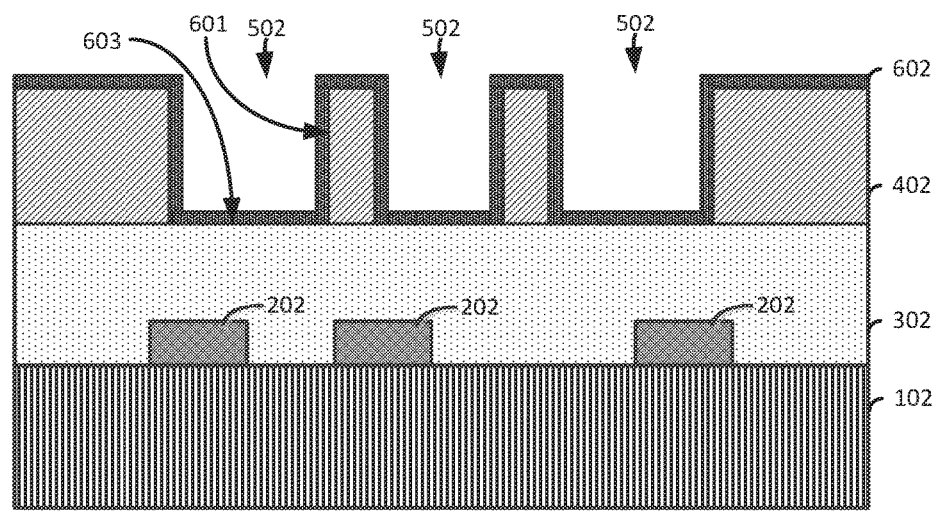

FIG. 6 illustrates a side view following the deposition of a first terminal layer 602 over exposed portions of the interlayer dielectric layer 302 and the deformable dielectric material 402. The first terminal layer 602 is formed conformally over the exposed portions of the interlay dielectric layer 302 and sidewalls 601 and bottoms 603 of the cavities 502. The first terminal layer 602 includes a conductive material such as, for example a conductive metal. Non-limiting examples of suitable conductive metals include aluminum (Al), platinum (Pt), gold (Au), tungsten (W), titanium (Ti), or any combination thereof.

The first terminal layer 602 may be deposited by a suitable deposition process, for example, chemical vapor deposition (CVD), plasma enhanced chemical vapor deposition (PECVD), plasma vapor deposition (PVD), plating, thermal or e-beam evaporation, and sputtering.

Figure 7:
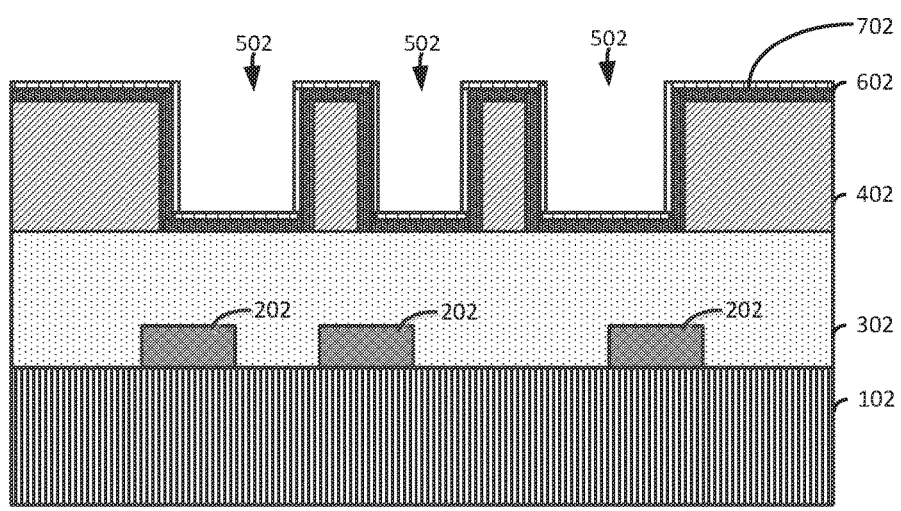

FIG. 7 illustrates a side view following the deposition of a capacitor dielectric layer 702 over exposed portions of the first terminal layer 602. The capacitor dielectric layer 702 may include, for example, a nitride or oxide material.

Figure 8:
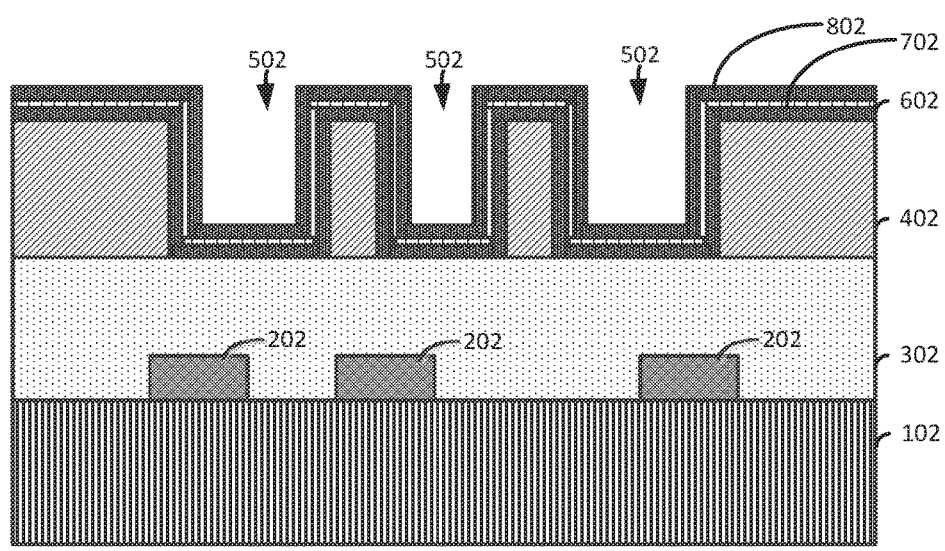

FIG. 8 illustrates a side view following the deposition of a second terminal layer 802 over exposed portions of the capacitor dielectric layer 702. The second terminal layer 802 includes a conductive material such as, for example, a conductive metal as described above in FIG. 6.

Figure 9:
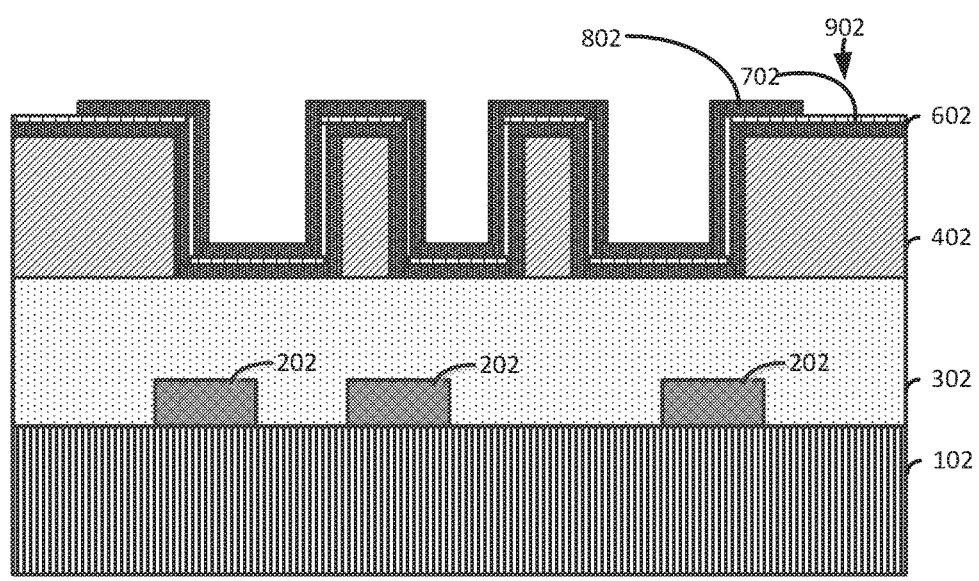

FIG. 9 illustrates a side view following a lithographic patterning and etching process that removes exposed portions of the second terminal layer 802 and exposes portions of the capacitor dielectric layer 702 in the region 902. The resultant structure may be formed by, for example, patterning a mask (not shown) over portions of the second terminal layer 802 and performing a selective etching process that removes exposed portions of the second terminal layer 802 to expose the region 902 of the capacitor dielectric layer 702.

Figure 10:
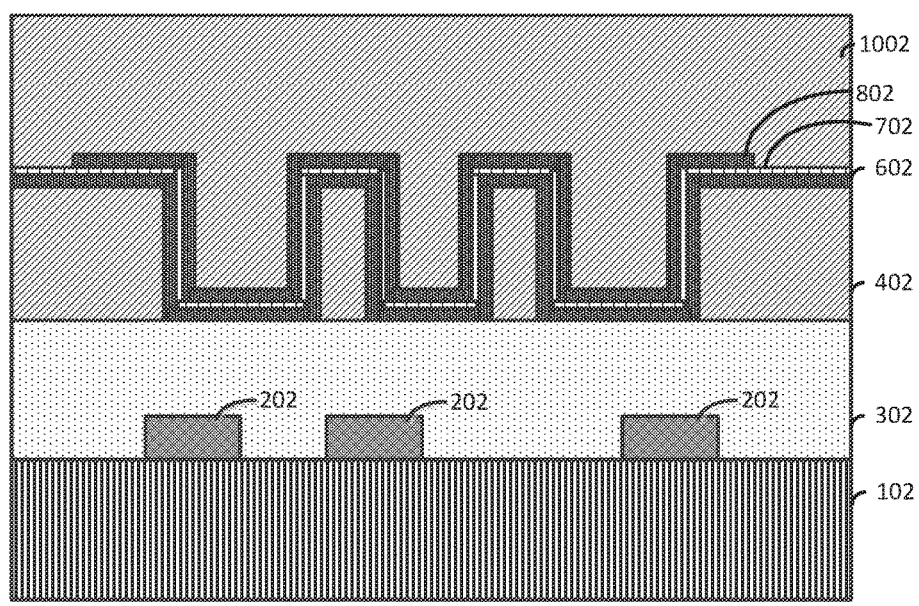

FIG. 10 illustrates a side view following the deposition of a second deformable dielectric material layer 1002 over exposed portions of the capacitor dielectric layer 702 and the second terminal layer 802. The second deformable dielectric material layer 1002 fills the cavities 502 (of FIG. 9). Following the deposition of the second deformable dielectric material layer 1002 a planarization process such as, for example, chemical mechanical polishing (CMP) may be performed.

Figure 11:
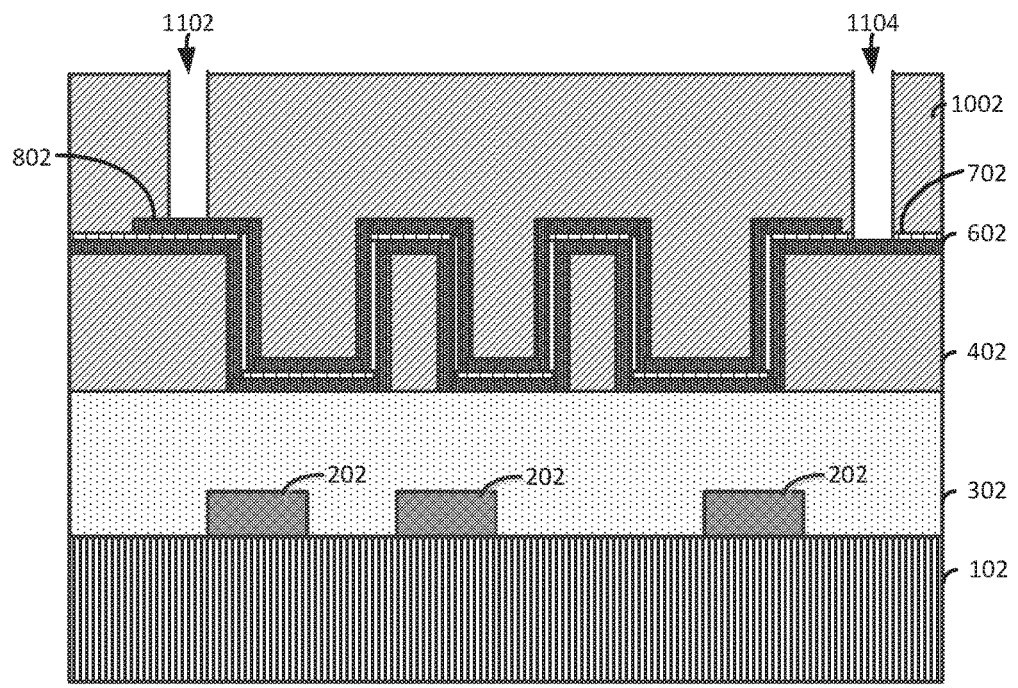

FIG. 11 illustrates a side view following the formation of cavities 1102 and 1104. The cavities 1102 and 1104 are formed by, for example, a lithographic patterning and etching process that removes portions of the second deformable dielectric material layer 1002. The cavity 1102 exposes a portion of the second terminal layer 802 and the cavity 1104 exposes a portion of the first terminal layer 602.

Figure 12:
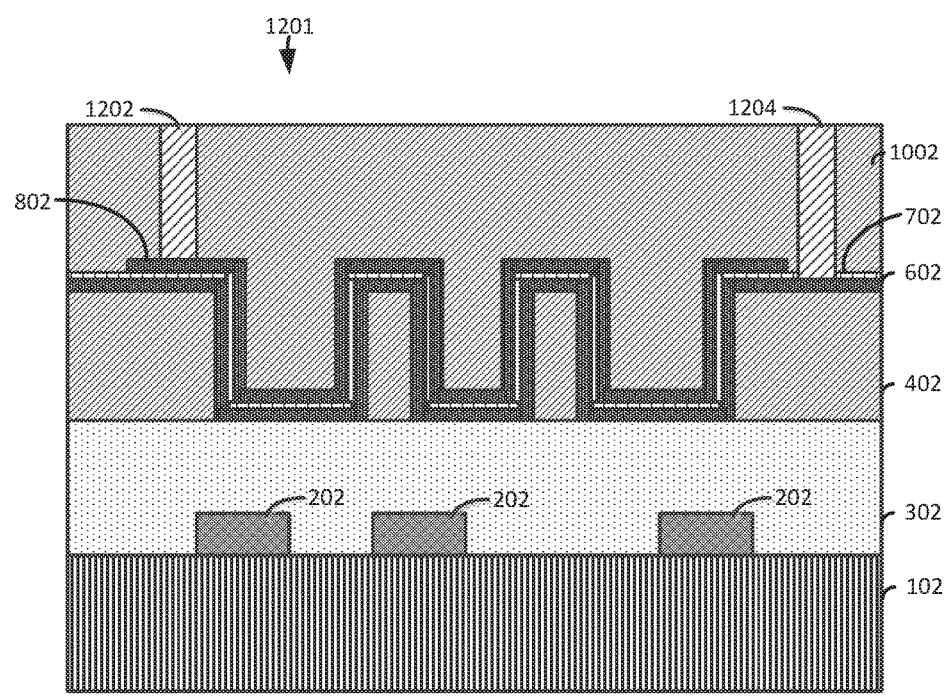

FIG. 12 illustrates a side view of the capacitive device 1201 following the formation of conductive contacts 1202 and 1204 in the cavities 1102 and 1104 (of FIG. 11). In some embodiments, a liner layer (not shown) may be deposited in the cavities prior to forming the conductive contacts 1202. The conductive contact 1202 contacts the second terminal layer 802, and the conductive contact 1204 contacts the first terminal layer 602.

Figure 13:
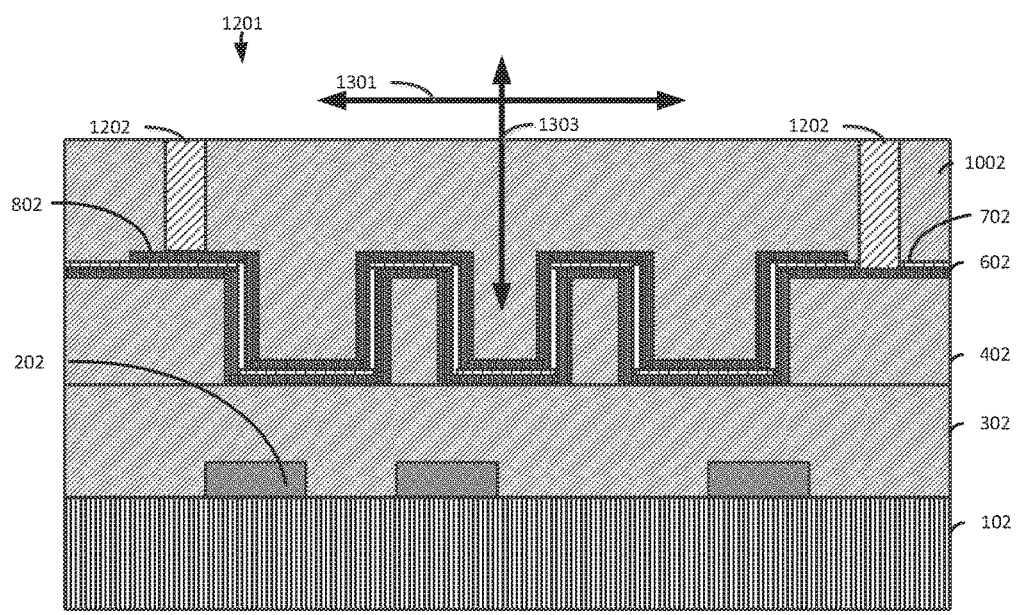
FIG. 13 illustrates a side view of the capacitive device with a force applied along the line that stretches the capacitive device linearly along the line.

FIG. 13 illustrates a side view of the capacitive device 1201 with a force applied along the line 1301 that stretches the capacitive device 1201 linearly along the line 1301. When stretched, the distance between the first terminal layer 602 and the second terminal layer 802, which is partially defined by the capacitor dielectric layer 702 remains substantially uniform. Thus, the capacitive properties of the capacitive device 1201 remains substantially constant when the capacitive device 1201 is flexed, deformed, or stretched.

Similarly, the capacitive device 1201 may be deformed by applying a force along the line 1303 either independently or while a force is being applied along the line 1301. Thus, the capacitive device 1201 may be flexed, bent, twisted, or deformed and the distance between the first terminal layer 602 and the second terminal layer 802, which is partially defined by the capacitor dielectric layer 702 will remain substantially uniform.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a capacitive device, the method comprising:
    forming a first dielectric layer on a substrate;
    removing portions of the first dielectric layer to form a cavity and peaks in the first dielectric layer;
    depositing a first layer of conductive material on the first dielectric layer and conformally along sidewalls of the cavity and on the peaks;
    depositing a second dielectric layer on the first layer of conductive material of the cavity and on the peaks;
    depositing a second layer of conductive material on the second dielectric layer to form a capacitive device;
    removing a portion of the second layer of conductive material on a top of one of the peaks prior to depositing a third dielectric layer;
    depositing the third dielectric layer directly on a top surface of the second layer of conductive material so as to have no intervening layer between the third dielectric layer and the second layer of conductive material on the to of the one of the peaks, the third dielectric layer both filling in the cavity and covering the peaks of the first dielectric layer;
    forming a second cavity through the third dielectric layer so as to expose the first layer of conductive material in the second cavity on the top of the one of the peaks, the second cavity extending through the second dielectric layer in order to expose the first layer of conductive material;
    forming a third cavity on top of another one of the peaks so as to expose the second layer of conductive material.

2. The method of claim 1, further comprising removing a portion of the second dielectric layer to expose a portion of the first layer of conductive material.

3. The method of claim 2, further comprising:
    removing a portion of the third dielectric layer to form the second cavity that exposes the portion of the first layer of conductive material; and
    depositing a conductive material in the second cavity to form a first conductive contact.

4. The method of claim 1, further comprising:
    removing a portion of the third dielectric layer to form the third cavity that exposes a portion of the second layer of conductive material on the top of the another one of the peaks; and
    depositing a conductive material in the third cavity to form a second conductive contact.

5. The method of claim 1, wherein the substrate is a flexible substrate.

6. The method of claim 1, wherein the first dielectric layer and the second dielectric layer are dissimilar materials.

7. The method of claim 1, wherein the removing portions of the first dielectric layer to form a cavity in the first dielectric layer includes forming a plurality of cavities in the first dielectric layer, and the depositing the first layer of the conductive material on the first dielectric layer and conformally along the sidewalls of the cavity includes depositing the first layer of the conductive material conformally along sidewalls of the plurality of cavities in the first dielectric layer.

8. The method of claim 1, further comprising planarizing the first dielectric layer prior to removing the portions of the first dielectric layer for form the cavity in the first dielectric layer.

9. The method of claim 1, further comprising etching to form the third cavity in the third dielectric layer.

10. The method of claim 9, wherein the third cavity in the third dielectric layer exposes a portion of the second layer of conductive material.

11. The method of claim 9, wherein the third cavity in the third dielectric layer is configured to provide contact to the second layer of conductive material.

* * * * *